US011388843B2

(12) United States Patent
Ebermann et al.

(10) Patent No.: US 11,388,843 B2
(45) Date of Patent: Jul. 12, 2022

(54) EQUIPMENT CABINET AND METHOD FOR OPERATING A COOLING DEVICE

(71) Applicant: VERTIV INTEGRATED SYSTEMS GMBH, Arnstorf (DE)

(72) Inventors: Heiko Ebermann, Dresden (DE); Peter Koch, Vilgertshofen (DE)

(73) Assignee: VERTIV INTEGRATED SYSTEMS GMBH, Arnstorf (DE)

( * ) Notice: Subject to any disclaimer, the term of this patent is extended or adjusted under 35 U.S.C. 154(b) by 0 days.

(21) Appl. No.: 17/047,026

(22) PCT Filed: May 13, 2019

(86) PCT No.: PCT/EP2019/062183
§ 371 (c)(1),
(2) Date: Oct. 12, 2020

(87) PCT Pub. No.: WO2019/238326
PCT Pub. Date: Dec. 19, 2019

(65) Prior Publication Data
US 2021/0195803 A1 Jun. 24, 2021

(30) Foreign Application Priority Data

Jun. 11, 2018 (DE) ...................... 10 2018 113 806.7

(51) Int. Cl.
*H05K 7/20* (2006.01)
(52) U.S. Cl.
CPC ................ *H05K 7/20736* (2013.01)
(58) Field of Classification Search
None
See application file for complete search history.

(56) References Cited

U.S. PATENT DOCUMENTS 8,514,571 B2 8/2013 Ji et al.
9,195,243 B2 * 11/2015 Chang ................ H05K 7/20836
(Continued)

FOREIGN PATENT DOCUMENTS

EP 2456293 A2 5/2012
WO WO-2007019304 A2 2/2007
(Continued)

OTHER PUBLICATIONS

International Search Report (in English and German) and Written Opinion (in German) issued in PCT/EP2019/062183, dated Aug. 22, 2019; ISA/EP.

(Continued)

*Primary Examiner* — Mukundbhai G Patel
(74) *Attorney, Agent, or Firm* — Harness, Dickey & Pierce, P.L.C.

(57) ABSTRACT

The invention relates to an equipment cabinet for receiving information-technology (IT) and communication-technology components which generate waste heat during operation. Here, the IT and communication-technology components draw in cooling air from the front side of the equipment cabinet for cooling and discharge this air into a hot-air region after having been heated. The air is guided out of the hot-air region and cooled by a cooling device comprising fans. Furthermore, sensors are provided for determining the pressure differential between the pressure in the hot-air region and in the surroundings of the equipment cabinet. In addition, a method is described for regulating a cooling device in an equipment cabinet of this kind.

12 Claims, 1 Drawing Sheet

(56) References Cited

U.S. PATENT DOCUMENTS

| | | |
|---|---|---|
| 10,037,061 B1 * | 7/2018 | Panchapakesan ......... G06F 1/20 |
| 2009/0059523 A1 | 3/2009 | Mallia et al. |
| 2015/0003010 A1 | 1/2015 | Kinstle, III |

FOREIGN PATENT DOCUMENTS

| | | | | |
|---|---|---|---|---|
| WO | WO20091.56649 | * | 12/2009 | ............... G06F 1/20 |
| WO | WO-2009156649 A1 | | 12/2009 | |

OTHER PUBLICATIONS

International Preliminary Report on Patentability (Chapter II of the Patent Cooperation Treaty), issued in PCT/EP2019/062183, dated Apr. 23, 2020; IPEA/EP.
Indian Office Action issued in corresponding India Patent Application No. 202017049858 dated Jul. 30, 2021.

* cited by examiner

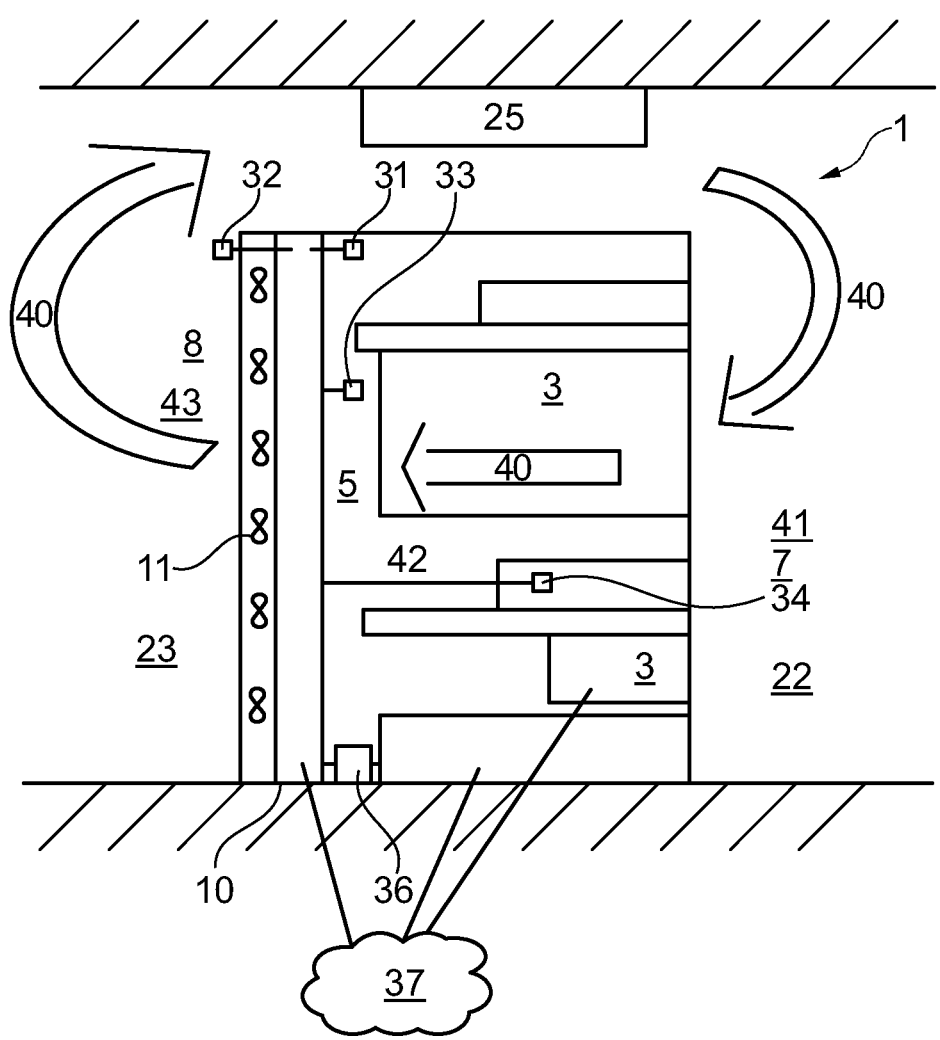

EQUIPMENT CABINET AND METHOD FOR OPERATING A COOLING DEVICE

CROSS-REFERENCE TO RELATED APPLICATIONS

This application is a National Stage of International Application No. PCT/EP2019/062183 filed on May 13, 2019. This application claims the priority to German Patent Application No. 10 2018 113 806.7, filed on Jun. 11, 2018. The entire disclosures of the above applications are incorporated herein by reference.

FIELD

The invention relates to an equipment cabinet for receiving information-technology (IT) and communication-technology components which generate waste heat during operation. This equipment cabinet has a front side and a rear side. The equipment cabinet and/or the IT and communication-technology components are designed to use cooling air from the front side of the equipment cabinet for cooling and to discharge this cooling air towards the rear side as heated exhaust air, which is also referred to as hot air. In order to cool the hot air, a cooling device is provided which cools the hot air and discharges it into the surroundings of the equipment cabinet, the cooling device comprising fans for drawing in the hot air and blowing out the cooled hot air. The IT and communication-technology components which are provided in the equipment cabinet form a hot-air region with hot air on the rear side thereof.

The invention further relates to a method for operating a cooling device, in particular the fans of a cooling device, for an equipment cabinet for receiving IT and communication-technology components which generate waste heat during operation. Here, the equipment cabinet has a front side and a rear side, the equipment cabinet and/or the IT and communication-technology components being designed to use cooling air from the front side for cooling and to discharge this cooling air towards the rear side as heated exhaust air, which is also referred to as hot air. Here, in order to cool the hot air, the cooling device is provided which cools the hot air and discharges it into the surroundings of the equipment cabinet. The cooling device comprises fans for drawing in the hot air and blowing out the cooled hot air.

Within the meaning of the invention, IT and communication-technology components may for example be understood to mean telecommunications equipment, switches, or network components, but also UPSs.

BACKGROUND

This section provides background information related to the present disclosure which is not necessarily prior art.

Generic equipment cabinets, which are also referred to as server cabinets, are used for receiving IT and communication-technology components such as servers. These servers generate waste heat during operation which needs to be discharged from the equipment cabinet. It is part of the prior art here that cool air flows in or is drawn in from the front side of the equipment cabinet, flows over the components of the server that are producing waste heat, and the thus heated air, which is referred to in the following as hot air, is discharged towards the rear side of the equipment cabinet. In order not to discharge the hot air into the surroundings of the equipment cabinet, it is often provided that a cooling device, i.e. a heat exchanger, is provided in the peripheral construction of the equipment cabinet, which device cools the hot air and then discharges the cooled hot air into the surroundings.

The air flow required for this purpose from the front side of the equipment cabinet to the rear side of the equipment cabinet is achieved by fans, which are sometimes provided on or in servers and actively draw the air into the cabinet and discharge it again on the rear side of the servers. It is likewise provided that, alternatively or additionally, fans are also provided on the cooling devices which in turn draw the air through the servers such that cold air is drawn into the servers, is drawn out again on the rear side of the servers and is drawn into the cooling device. The fans are also used to blow the cooled hot air out of the cooling device again into the surroundings.

The use of fans in conjunction with a cooling device is particularly useful or necessary if passive IT and communication-technology components are also provided in the equipment cabinet. This means that these components do not comprise any active air-guidance or air-moving means. It is then necessary for air to be actively drawn over these passive IT and communication-technology components by other means, such as the fans in the cooling device. For example, this may be a UPS, which itself does not comprise active fans, but comprises corresponding ventilation channels.

A requirement is to cool the IT and communication-technology components as optimally as possible without expending too much energy in the process. This means that the cooling temperature of the cooled hot air, but also of the air flow, i.e. the volume flow rate per unit time, can be adjusted. This is currently often implemented in equipment cabinets having a cooling device arranged at the rear by means of temperature sensors which measure the outlet temperature of the cooled hot air. If the outlet temperature of the cooled hot air is above a threshold value, for example, either a higher cooling capacity is initiated or the fans in the cooling devices are made to run faster so that a greater volume flow rate is drawn through the IT and communication-technology components such that the air entering the cooling device is already cooler.

SUMMARY

This section provides a general summary of the disclosure, and is not a comprehensive disclosure of its full scope or all of its features.

The object underlying the invention is to provide an equipment cabinet and a method for regulating a cooling device by means of which effective cooling of components in an equipment cabinet is made possible.

Preferred embodiments of the invention are set out in the dependent claims and in the description.

A generic equipment cabinet is developed according to the invention in that sensors are provided for determining the pressure differential between the hot-air region and the discharge region for the cooled hot air from the cooling device to the surroundings, and in that the cooling device is designed and configured to maintain a specified pressure in the hot-air region by means of the fans, the pressure being less than or equal to the pressure in the surroundings of the equipment cabinet.

A basic concept of the invention can be considered that of deviating from regulation of the cooling device, in particular the fans thereof, only on the basis of measured temperatures. The invention is based on the knowledge that the pressure ratios in the hot-air region, which can also be referred to as the hot air plenum, are essential to the air flow over the IT and communication-technology components which is used for the cooling.

If overpressure prevails here, i.e. if more air is drawn or blown over the IT and communication-technology components by the fans provided than can be expelled again by the cooling device, the fans provided at the IT and communication-technology components have to provide more capacity than necessary, which results in increased wear of the fans.

Likewise, in the event of overpressure, the hot air may flow forwards back out of the hot air plenum towards the front side of the equipment cabinet, to the intake region or inflow region for the cooling air. This has a negative impact on the ability to cool all the components in the equipment cabinet.

It may also be disadvantageous for a significant negative pressure to prevail in the hot air plenum. This means that the fans of the cooling device transport more air, i.e. draw more air out of the hot air plenum, than flows over the IT and communication-technology components or the fans thereof into the hot air plenum. In addition to the increased energy consumption of the fans of the cooling device, there is also an increased risk here of drawing in infiltrated air, i.e. to intake air from outside the equipment cabinet which has not been conveyed over the IT and communication-technology components and used to cool said components.

Therefore, it is provided according to the invention to use the pressure differential between the hot-air region and the surroundings as a benchmark. Ideally, the pressure, in particular the static pressure, should be determined and evaluated once in the hot-air region and once at the front side of the equipment cabinet here. Since the pressure differential is supposed to be used for regulating the cooling device, however, and the corresponding regulating means are also provided therein, it is entirely impractical for corresponding lines of the cooling device, which are often located on the rear side of an equipment cabinet, to have to be installed through the equipment cabinet to the front side. Therefore, the invention is based on further knowledge, specifically that the pressure at the discharge region of the cooled hot air of the cooling device substantially corresponds to the pressure that prevails in front of the equipment cabinet, on the front side thereof. Therefore, using relatively short lines the static pressure can be determined on the one hand on the rear side of the equipment cabinet, i.e. at the discharge region of the cooled hot air of the cooling device, and on the other hand in the hot-air region. By means of these two pressure values, a pressure differential can be calculated and the cooling device, in particular the fans thereof, can be controlled such that the pressure in the hot-air region is equal to or only slightly less than the ambient pressure of the equipment cabinet.

In a preferred embodiment, the cooling device is constructed as a rear-door cooling device, which is provided on the rear wall or door of the equipment cabinet or in place of the rear door of the equipment cabinet.

A construction of this kind on the one hand makes it possible to easily attach the cooling device. On the other hand it is thus made possible, without additional diversions, to draw the air used for cooling into the equipment cabinet from the front, to convey said air over the IT and communication-technology components, to discharge said air into the hot-air region and to cool said air from the hot-air region by means of the cooling device in the form of a rear-door cooler and to conduct it away again towards the rear.

It is advantageous for at least one sensor for determining the pressure in the hot-air region to be provided in or on the frame of the equipment cabinet, in particular in a groove. The pressure detected by the sensors for determining the pressure is preferably intended to be static pressure and not dynamic pressure. "Static" means that this is pressure without environmental influences, in particular air flows. In the hot-air region, however, due to the construction there are strong air flows, since, here, the air is blown in through the IT and communication-technology components and is then drawn out by the cooling device. Therefore, according to the invention, it has been found to be advantageous for the sensors for determining the pressure to be attached in a protected manner. A groove in a rack of the equipment cabinet can in particular be used for this purpose. Grooves of this kind are provided as standard for fastening components, and therefore they do not need to be additionally provided and they are, from experience, large enough to receive sensors of this kind. A corresponding measurement point has been found to be affected to a relatively small extent by the air flow in the hot-air region.

In the region of the equipment cabinet, at least one temperature sensor can further be provided at at least one of the following positions: outside the equipment cabinet, on the front side of the equipment cabinet, in the hot-air region, in the discharge region of the cooling device, in front of, behind or within the IT and communication-technology components. In this regard, the cooling device can be designed and configured to likewise regulate the pressure in the hot-air region on the basis of the temperature additionally detected by the at least one temperature sensor. Regulation of this kind can be considered to be dynamic pressure regulation, in which a specified pressure in the hot region is no longer maintained by the fans of the cooling device, but instead this pressure is adapted on the basis of the measurement result from the temperature sensor(s).

For example, if it is determined that a temperature sensor provided within or on the IT and communication-technology components displays a higher temperature than desired, the static pressure is reduced in the hot-air region by the fans of the cooling device being operated at a higher speed. This means that the air flow over the IT and communication-technology components is increased and that they are cooled in an improved manner. In a similar way, if a very high temperature is measured in the hot-air region, the negative pressure in the hot-air region can likewise be increased. In reverse, if a very cool temperature is detected in the discharge region of the cooling device which is below a target value, it is for example also possible for the fans to operate at a lower speed and to thus reduce the pressure in the hot-air region such that less air is conveyed overall, which in turn means that a lower cooling capacity is provided.

Alternatively and additionally, devices may be provided for detecting the entirety of or at least the majority of the power consumption of the IT and communication-technology components and the cooling device may be accordingly designed and configured to regulate the pressure in the hot region on the basis of the detected power consumption. It is for example possible here for the entirety of the current consumption of the IT and communication-technology components provided in the equipment cabinet to be detected on the basis of a PDU (power distribution unit) and for this to be used for regulating the cooling device.

If, for example, it is detected here that there is higher power consumption, it can be concluded therefrom that an increased build-up of heat can also be expected, with a slight delay. The cooling device can react to this as a precaution by the pressure being reduced in the hot-air region, i.e. by the fans of the cooling device running at a higher speed such that a greater air volume per unit is conveyed and improved cooling of the IT and communication-technology components is made possible.

A generic method is developed by the invention by a pressure differential being determined between the pressure in a hot-air region which is formed on the rear side of the IT and communication-technology components in the equipment cabinet and a discharge region of the cooled hot air from the cooling device to the surroundings. Furthermore, the fans of the cooling device are operated such that a specified pressure is reached in the hot-air region, the pressure being less than or equal to the pressure in the surroundings of the equipment cabinet.

As a result of regulating the differential pressure in this way, efficient cooling of the IT and communication-technology components in the equipment cabinet is achieved without expending unnecessary energy, as already described above in relation to the equipment cabinet. As explained, the invention is based on the knowledge that, on one hand, the regulation by means of the pressure differential between pressure outside the equipment cabinet and pressure inside the equipment cabinet allows for a more rapid reaction than regulation on the basis of temperature. On the other hand, there is the knowledge that, when using a rear-door heat cooler, it is advantageous to only determine the pressure differential between the outlet point on the cooling device and the hot-air region. This does not involve great cabling complexity, and it can even be implemented as a retrofit solution.

Depending on the elements installed in the equipment cabinet, it is desirable for the pressure in the hot-air region to approximately correspond to the ambient pressure, i.e. for the pressure differential to be zero. If passive components or components having weak fans are provided in the equipment cabinet, it may be advantageous for the pressure differential to be negative; this means that the static pressure in the hot-air region is lower than outside the equipment cabinet such that the cooling air being drawn in from the front side of the equipment cabinet is assisted.

Another advantage of regulating the cooling device on the basis of the pressure gradient is that the desired pressure is therefore always present, irrespective of what is inside the equipment cabinet. This is advantageous in particular if the equipment cabinet is frequently modified and if, for example, blind covers for the components are present or are omitted.

The pressure in the hot-air region may additionally be regulated on the basis of one or more measured temperatures, with the temperatures for example being measured at one or more of the following positions: outside the equipment cabinet, on the front side of the equipment cabinet, in the hot-air region, at the discharge region of the cooling device, in front of, behind or within the IT and communication-technology components. As a result of additionally regulating the pressure on the basis of the temperature, reactions can be instigated promptly to any temperature fluctuations. In other words, an adaptive pressure regulation of the pressure in the hot-air region then takes place. As a result, reference can be made to modified power or environmental criteria. For example, if the computing center in which the equipment cabinet is provided comprises computing-center cooling but is no longer providing the desired power due to the external temperature, this can be taken into account by the change in the pressure differential, in particular by further decreasing the static pressure in the hot-air region, and therefore a cooling capacity that is as consistent as possible is provided for the IT and communication-technology components provided in the equipment cabinet.

Alternatively or optionally, the power consumption of all or at least the majority of the IT and communication-technology components in the equipment cabinet can be determined, and the pressure in the hot-air region can be regulated on the basis of this power consumption. The power consumption can be determined by PDUs, for example. This makes it possible to make a prediction on the heat build-up of the IT and communication-technology components and to also provide less cooling capacity if power consumption is reduced, for example, i.e. the pressure in the hot-air region has a tendency to increase, such that there is a lower volume flow rate of air per unit of time over the IT and communication-technology components. This means that the fans of the cooling device do not have to run as fast and therefore energy can be saved.

Likewise, data can be obtained from the server management, in particular the CPU power and/or computing power, network power or the like, and the pressure in the hot region can be varied on the basis of this data from the server management. Regulation of this kind has similar advantages to regulation in relation to the power consumption.

Further areas of applicability will become apparent from the description provided herein. The description and specific examples in this summary are intended for purposes of illustration only and are not intended to limit the scope of the present disclosure.

DRAWINGS

The drawing described herein is for illustrative purposes only of selected embodiments and not all possible implementations, and are not intended to limit the scope of the present disclosure.

The invention is explained in the following on the basis of an exemplary embodiment and a schematic drawing, in which:

FIG. 1 is a schematic view of an equipment cabinet according to the invention in a computer center.

Corresponding reference numerals indicate corresponding parts throughout the several views of the drawings.

DETAILED DESCRIPTION

Example embodiments will now be described more fully with reference to the accompanying drawing.

FIG. 1 is a highly simplified sectional view of an equipment cabinet 1 according to the invention. IT and communication-technology components, which can also be referred to as equipment, are shown in the equipment cabinet 1. These components may for example be servers, communication equipment, switches, network components, UPSs or other such components. In the following, they are referred to in simplified form as servers 3.

A cooling device 10 which comprises a large number of fans 11 is provided on the rear side 8 of the equipment cabinet 1. A hot-air region 5 is formed between the servers 3 and the cooling device 10. This region will be described in greater detail below.

The basic mode of operation of an equipment cabinet 1 of this kind is that cooling air 41 flows over the servers 3 into the interior of the equipment cabinet 1. When this air flows over the servers 3, they are cooled, or heat is discharged, the cooling air 41 is heated and thus enters the hot-air region 5 as hot air 42. From there, the air exits again through the cooling device 10 on the rear side 8 of the equipment cabinet 1. When passing through the cooling device 10, which may for example be constructed as a rear-door heat exchanger, the hot air 42 is cooled and exits as cooled hot air 43. This results in an air flow 40 which is conveyed from a front side 7, through the equipment cabinet 1 to the rear side 8 thereof again outwards and is conveyed above the equipment cabinet 1 in the computer center back to the front side 7.

By means of the fans 11 in the cooling device 10, the air can be drawn in from the front side 7 of the equipment cabinet 1 over the servers 3. In addition, it is often provided that the servers 3 themselves comprise active fans and, by means of these fans, draw in air from the front side 7 and actively blow this air out into the hot-air region 5.

A certain static pressure is produced in the hot-air region 5 depending on these fans, in particular how strongly they blow the air into the hot-air region and how strongly air exits the hot-air region through the cooling device 10 or is drawn out by the fans 11 thereof. Ideally, this pressure is intended to substantially correspond to the pressure in front of the equipment cabinet 1 in the space 22. This means that there are no undesired air flows over the servers 3.

The static pressure in the hot-air region 5 can substantially be affected by the fans 11 of the cooling device 10, i.e. if the fans run faster, the pressure decreases and if the fans run slower, the pressure increases. In principle, a measurement of the pressure in front of the equipment cabinet 1 in the space 22 and in the hot-air region 5 would therefore be helpful. Since, however, a cable or sensor line would have to be installed to the front side 7 of the server cabinet 1, this results in increased cabling complexity.

According to the invention, since the rear side 8 with the space 23 behind the equipment cabinet 1 is substantially in the same surroundings as the front side 7 of the equipment cabinet 1 with the space 22 in front of the equipment cabinet 1, it has been found that substantially the same static pressure prevails in these two regions. This means that it is sufficient to determine the static pressure behind the equipment cabinet 1 and in the hot-air region 5 in the equipment cabinet. For this purpose, according to the invention, a first pressure sensor 31 is provided in the hot-air region 5 and a second pressure sensor 32 is provided in the rear region of the equipment cabinet 1 or on the rear region of the cooling device 10, for example.

If the pressure is determined by these two sensors and the pressure differential is identified, the pressure in the hot-air region 5 can be set such that it ideally corresponds to the external pressure or is at most slightly lower than said external pressure, so that it is ensured that there is an air flow over the servers 3 and no undesired backward flow occurs.

If, however, there are narrowed areas, for example due to built-in components 25, in the space in which the equipment cabinet 1 is positioned, the air pressure behind the equipment cabinet 1 may become slightly higher than the air pressure in front of the equipment cabinet 1. This can, for example, be taken into account by a corresponding offset in the regulation with regard to the air pressure in the hot-air region 5.

In addition, temperature sensors can also be provided from which the results are likewise used for regulating the pressure in the hot-air region 5. By way of example, a first temperature sensor 33 is provided in the hot-air region 3 and a second temperature sensor 34 is provided in or on the servers 3 for this purpose. If, for example, the temperature measured by one or both of the sensors 33, 34 increases, it can be concluded that improved cooling is required. As a result, the pressure in the hot-air region 5 is decreased by a higher rotational ventilation speed of the fans 11, such that more cool air 41 flows from the front side 7 of the equipment cabinet 1 through or over the servers 3.

Other indicators for the pressure regulation may for example be the current power consumption of the servers 3, which can for example be determined by a PDU (power distribution unit) and can be made available to the cooling device 10. In a similar way, data regarding the current power can also be made available by a server management 37.

By means of the equipment cabinet according to the invention and the method according to the invention for regulating a cooling device, it is thus possible to facilitate an effective cooling of the components in the equipment cabinet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

What is claimed is:

1. An equipment cabinet in which IT and communication-technology components are received and which generate waste heat during operation, comprising:
   a front side and a rear side;
   the equipment cabinet and/or the IT and communication-technology components being designed to use cooling air ingested from the front side for cooling, and to discharge the cooling air as hot air from the rear side into a discharge region adjacent to, and exterior of, the rear side of the equipment cabinet, the hot air forming heated exhaust air;
   a cooling device configured to receive the hot air from a hot air region within the equipment cabinet and to cool the hot air, and to discharge the hot air from the equipment cabinet as cooled hot air into an area surrounding the equipment cabinet, which includes the discharge region;
   the cooling device comprising at least one fan for drawing in the hot air and blowing out the cooled hot air;
   the hot air region containing the hot air being formed on a rear side of the IT and communication-technology components in the equipment cabinet;
   sensors being included for determining a relative negative pressure which corresponds to a pressure differential between a pressure in the hot air region and a pressure in the discharge region for the cooled hot air of the cooling device; and
   wherein the sensors for determining the relative negative pressure for determining the pressure differential between the hot air region and the discharge region for the cooled hot air of the cooling device to the area surrounding the equipment cabinet are arranged in the hot air region and in the area surrounding the equipment cabinet;
      wherein the equipment cabinet and/or the IT and communication-technology components are designed to discharge the heated exhaust air towards the rear side;
      the cooling device is designed and configured to maintain a specified pressure in the hot air region by means of the at least one fan, wherein the specified pressure is less than or equal to the pressure in the area surrounding the equipment cabinet;

a first temperature sensor is provided in the hot air region, and a second temperature sensor is provided in front of, or behind or within the IT and communication-technology components;

wherein the cooling device is designed and configured to regulate the pressure in the hot air region on the basis of the temperature detected by the first and second temperature sensors, and at least one of:
the cooling device is designed and configured to regulate the pressure in the hot air region on the basis of a current power consumption of the IT and communication-technology components; and/or
the cooling device is designed and configured to regulate the pressure in the hot air region on the basis of data from a server management component, and wherein the data includes at least one of CPU power, computer utilization and/or network utilization.

2. The equipment cabinet of claim 1, wherein the cooling device is constructed as a rear-door cooling device.

3. The equipment cabinet of claim 2, wherein the rear-door cooling device forms a rear door of the equipment cabinet.

4. The equipment cabinet of claim 1, wherein the cooling device is provided in place of a rear door of the equipment cabinet.

5. The equipment cabinet of claim 1, wherein the at least one of the sensors is arranged on a frame of the equipment cabinet.

6. The equipment cabinet of claim 5, wherein the at least one of the sensors is arranged in a groove of the frame of the equipment cabinet.

7. The equipment cabinet of claim 1, further comprising a plurality of vertically arranged fans configured to form the cooling device.

8. An equipment cabinet in which IT and communication-technology components are received and which generate waste heat during operation, comprising:
a front side and a rear side;
the equipment cabinet and/or the IT and communication-technology components designed to use cooling air ingested from the front side for cooling, and to discharge the cooling air as hot air from the rear side into a discharge region adjacent the rear side of the equipment cabinet, the hot air forming heated exhaust air;
a cooling device configured to receive the hot air from a hot air region within the equipment cabinet and to cool the hot air, and to discharge the hot air from the equipment cabinet as cooled hot air into an area surrounding the equipment cabinet;
the cooling device comprising a plurality of fans arranged vertically and adjacent the rear side of, and within, the equipment cabinet, for drawing in the hot air and blowing out the cooled hot air from the equipment cabinet;
the hot air region containing the hot air being formed on a rear side of the IT and communication-technology components in the equipment cabinet;
sensors being included for determining a relative negative pressure which corresponds to a pressure differential between a pressure in the hot air region and a pressure in the discharge region for the cooled hot air of the cooling device to the area surrounding the equipment cabinet; and wherein the sensors for determining the relative negative pressure for determining the pressure differential between the hot air region and the discharge region for the cooled hot air of the cooling device to the area surrounding the equipment cabinet are arranged in the hot air region and in the area surrounding the equipment cabinet;

wherein the equipment cabinet and/or the IT and communication-technology components are designed to discharge the heated exhaust air towards the rear side;

the cooling device is designed and configured to maintain a specified pressure in the hot air region by means of the plurality of fans, wherein the specified pressure is less than or equal to the pressure in the area surrounding the equipment cabinet;

a first temperature sensor is provided in the hot air region, and a second temperature sensor is provided in front of, or behind or within the IT and communication-technology components;

wherein the cooling device is designed and configured to regulate the pressure in the hot air region on the basis of the temperature detected by the first and second temperature sensors, and at least one of:
the cooling device is designed and configured to regulate the pressure in the hot air region on the basis of a current power consumption of the IT and communication-technology components; and/or
the cooling device is designed and configured to regulate the pressure in the hot air region on the basis of data from an external component.

9. The equipment cabinet of claim 8, wherein the external component comprises a server management component.

10. The equipment cabinet of claim 9, wherein the data used by the server management component comprises at least one of CPU power, computer utilization and/or network utilization.

11. A method for operating a cooling device, in particular at least one fan of a cooling device, for an equipment cabinet in which IT and communication-technology components are received, and which generate waste heat during operation, wherein the equipment cabinet comprises a front side and a rear side, wherein the equipment cabinet and/or the IT and communication-technology components are designed to use cooling air ingested from the front side for cooling, which creates hot air after having passed at least one of through or over the IT and communication-technology components, the method comprising:
directing the hot air into a hot air region formed between a rear area of the IT and communication-technology components and the rear side of the equipment cabinet;
using at least one fan as a cooling device to cool the hot air received within the hot air region to create cooled hot air;
using the at least one fan to discharge the cooled hot air as heated exhaust air from the rear side of the equipment cabinet into an area surrounding the equipment cabinet, the area surrounding the equipment cabinet forming a discharge region;
further using the at least one fan to help control a pressure within the equipment cabinet to create a relative negative pressure, the relative negative pressure forming a pressure differential between the pressure in the hot air region and pressure in the discharge region for the cooled hot air of the cooling device to the surroundings;
further controlling the at least one fan so that a specified pressure is reached in the hot air region, wherein the specified pressure is less than or equal to the pressure in the area surrounding the equipment cabinet;

further regulating a pressure in the hot air region using at least one of the following:

using a first temperature sensor located in the hot air region to measure an air temperature in the hot air region, and using a second temperature sensor located in front of, or behind or within the IT and communication technology components to measure an air temperature in front of, or behind or within the IT and communication technology components; and using a determined power consumption of all or a majority of the IT and communication-technology components in the equipment cabinet, and regulating the pressure in the hot air region at least in part on the basis of the determined power consumption; and/or using data obtained from a server management component, the data including at least one of CPU power, computer utilization, or network utilization, and regulating the pressure in the hot air region at least in part using the data from the servermanagement component.

12. The method of claim 11, further comprising using a plurality of fans arranged adjacent the rear side of the equipment cabinet, to help control the pressure within the equipment cabinet.

* * * * *